United States Patent [19]
Taneda et al.

[11] Patent Number: 5,263,243
[45] Date of Patent: Nov. 23, 1993

[54] METHOD FOR PRODUCING MULTILAYER PRINTED WIRING BOARDS

[75] Inventors: Junichi Taneda; Keisuke Okada; Takumi Hiroto; Kouichi Hirosawa, all of Tokyo, Japan

[73] Assignee: NEC Corporation, Japan

[21] Appl. No.: 10,557

[22] Filed: Jan. 28, 1993

[30] Foreign Application Priority Data

Jan. 28, 1992 [JP] Japan .................... 4-13434

[51] Int. Cl.$^5$ .................................. H05K 3/36
[52] U.S. Cl. ............................ 29/830; 29/852; 156/89; 156/902; 179/262; 179/263; 361/792; 428/901
[58] Field of Search ............ 29/830, 852; 156/89, 156/902; 174/262, 263; 361/414; 428/901

[56] References Cited

U.S. PATENT DOCUMENTS

| 4,642,160 | 2/1987 | Burgess ................ 29/852 X |
| 4,668,332 | 5/1987 | Ohnuki et al. ........ 361/414 X |
| 4,681,795 | 7/1987 | Tuckerman ........... 428/901 X |
| 4,763,403 | 8/1988 | Klein et al. ............ 29/830 X |
| 4,774,127 | 9/1988 | Reagan et al. ........ 428/901 X |
| 4,780,957 | 11/1988 | Shiga et al. ............ 29/830 |
| 4,799,984 | 1/1989 | Rellick ................... 29/829 X |
| 4,824,511 | 4/1989 | Hartman et al. ....... 428/901 X |
| 4,908,940 | 3/1990 | Amano .................. 428/901 X |
| 4,925,723 | 5/1990 | Bujatti et al. .......... 428/901 X |
| 4,961,259 | 10/1990 | Schreiber ............... 29/852 |
| 5,079,065 | 1/1992 | Masakazu et al. ..... 428/901 X |
| 5,129,142 | 7/1992 | Bindra et al. .......... 29/830 X |

FOREIGN PATENT DOCUMENTS 2-16792  1/1990  Japan ............................ 428/901
2-143588 6/1990  Japan ............................. 29/830

Primary Examiner—Carl J. Arbes
Attorney, Agent, or Firm—Ostrolenk, Faber, Gerb & Soffen

[57] ABSTRACT

In a method for producing a multilayer printed wiring board, first and second copper foils for surface layer are disposed on both sides of an inner wiring substrate so that each of first and second prepreg sheets provided with through-holes is sandwiched between each of the copper foils for surface layer and each face of the substrate, the through-holes being formed therethrough at desired positions corresponding to positions where the connecting pads on each face of the substrate are formed, and the resulting structure is integrally bonded by applying heat and pressure thereto. During the heat- and pressure-processing step, the through-holes within the prepreg sheets are filled with a resin fused from the prepreg sheets. After selectively removing the copper foil for surface layer within an area which matches each of the connecting pads, the resin is selectively removed by the irradiation of laser beams to form via holes and allow the connecting pads to be exposed. Next, a conductive paste is embedded in the via holes. According to the above-mentioned method, it is possible to suppress occurrence of defective in boring of the via hole for electrically connecting circuit patterns of the surface layer to circuit patterns of the inner layer and also to shorten the production term and reduce the production cost.

15 Claims, 9 Drawing Sheets

METHOD FOR PRODUCING MULTILAYER PRINTED WIRING BOARDS

BACKGROUND OF THE INVENTION

1. Field of the Invention

This invention relates to a method for producing a multilayer printed wiring board and more particularly to a method for producing a multilayer printed wiring board provided with via holes (hereinafter referred to as "via T/H's") for electrically connecting circuit patterns of surface layers to circuit patterns of inner layers.

2. Description of the Prior Art

With rapid advance in electronic equipments, the development of electronic components, typified by semiconductor components, of high packaging density, high function and miniaturization has recently been advanced with great strides. In addition, the development of printed wiring boards for packaging these electronic components has recently been required for an increase in wiring channels thereof.

In general, if many wiring channels are desired, a multilayer printed wiring board having multilayered wiring layers is used. Particularly, since the multilayer printed wiring board provided with the via T/H's for selectively connecting the circuit patterns of the first- and second-surface layers to the circuit patterns of inner layers can dramatically increase the number of the wiring channels, such multilayer printed wiring board has widely been used in recent years.

Referring now to FIGS. 1 to 5, which are schematically and partially cross-sectional diagrams for explaining, in order, steps of a method for producing a multilayer printed wiring board of the prior art, a completed multilayer printed wiring board has a structure provided with via T/H's as shown in FIG. 5 and can be produced in the following manner.

First, as shown in FIG. 1, connecting pads 2 and inner circuit patterns 3 are formed by patterning upper and lower faces of a copper-clad insulating substrate (an inner wiring substrate) 1 to obtain prescribed patterns.

Then, as shown in FIG. 2, copper foils 5a and 5b for surface layer are disposed on the both faces of the substrate 1 through prepreg sheets (a glass cloth impregnated with an adhesive and dried) 4a and 4b, respectively, to assemble these members, and heat and pressure are applied to the resulting assembly using a pressure device. Thus, the copper foils 5a and 5b are integrally bonded to the substrate 1 by sandwiching each of the prepreg sheets 4a and 4b between each of the copper foils and each face of the substrate.

Next, as shown in FIG. 3, half through-holes 6 are selectively bored in the copper foils 5a and 5b and the prepreg sheets 4a and 4b so that they reach from the surface of each of the copper foils 5a and 5b to the connecting pads 2. Also, a through-hole 7 is selectively bored through the assembly so that it runs through one surface of the copper foils 5a and 5b to the other surface.

Thereafter, as shown in FIG. 4, copper plating is applied to the whole surface of the assembly including the inner walls of the half through-holes 6 and the through-hole 7 according to the conventional method to thus form a copper plating layer 8. By forming the copper plating layer 8 as mentioned above, the connecting pads 2 are electrically connected to the copper foils 5a and 5b. Since the copper plating layer 8 is also deposited on the inner walls of the through-hole 7, a through hole (i.e. a copper plated-through hole) 9 which electrically connects the copper foil 5a to the copper foil 5b is formed running through the assembly.

Finally, the copper plating layer 8 and the copper foils 5a and 5b are patterned to thereby give a completed multilayer printed wiring board provided with the via T/H's 10, the through hole 9 and wiring circuit patterns 11, as shown in FIG. 5.

Referring now to FIGS. 6 to 11, which are schematically and partially cross-sectional diagrams for explaining, in order, steps of another method for producing a multilayer printed wiring board of the prior art, another completed multilayer printed wiring board, which has a structure provided with via T/H's as shown in FIG. 11, can be produced in the following manner.

First, as shown in FIG. 6, through-holes 22 are selectively bored through a copper-clad insulating substrate 21 whose upper and lower faces are provided with copper foils 23a and 23b, respectively.

Then, as shown in FIG. 7, copper plating is applied to the whole surface of the substrate 21 including the inner walls of the through-holes 22 to thus form a copper plating layer 24. In this case, the copper plating layer 24 is deposited on the inner walls of the through-holes 22 and thus through holes (i.e. copper plated-through holes) 25 which electrically connect the copper foil 23a to the copper foil 23b are formed running through the substrate 21.

Next, as shown in FIG. 8, the copper plating layer 24 and copper foil 23b of one face of the substrate 21 are patterned to give inner circuit patterns 26.

In the same manner as mentioned above, there are prepared two of the substrates 21, one face of each substrate having the circuit patterns 26 formed thereon and the other face being covered by the copper foil and copper plating layer.

Then, as shown in FIG. 9, the two substrates 21 are disposed so that the faces having the inner circuit patterns 26 face each other and a prepreg sheet 27 is sandwiched between the faces, to assemble these members, and heat and pressure are applied to the resulting assembly or structure using a pressure device. Thus, the two substrates 21 are integrally bonded to each other through the prepreg sheet 27 sandwiched therebetween.

Next, as shown in FIG. 10, after a through-hole (not shown) is bored at desired position so that it runs through the first-surface of the assembly to the second-surface thereof, another copper plating is applied to the whole surface of the assembly including the inner wall of the through-hole to thus form a copper plating layer 28. The copper plating layer 28 is deposited within the through holes 25 to give via T/H's 29, and also the copper plating layer 28 is deposited on the inner wall of the above through-hole (not shown) to thus give a through hole (i.e. a copper plated-through hole) 30 which electrically connects the copper plating layer 24 of one face of the assembly to the copper plating layer 24 of the other face thereof.

Finally, the copper plating layers 28 and 24 and the copper foils 23a are patterned, to thereby give the completed multilayer printed wiring board provided with the via T/H's 29, through hole 30 and wiring circuit patterns 31 as shown in FIG. 11.

With the above-mentioned conventional method for producing the multilayer printed wiring board, however, there are some problems as discussed below.

In the method as shown in FIGS. 1 to 5, when the half through-hole 6 is drilled in the copper foil and prepreg sheet, it is necessary to set the extremely slow drilling speed since it is difficult to control a drilling depth. For this reason, in this conventional method, the production cost for the multilayer printed wiring board is very high and also the production term becomes longer. In addition, since a diameter of the half through-hole 6 is small, for instance, being of the order of 0.1 to 0.4 mm, the drill is easily broken during drilling and thus drilling failure easily occurs. Moreover, when the connecting pads having a width of 0.15 to 0.3 mm stand close together in a pitch of 0.2 to 0.5 mm, the drill easily slips from the required drilling position of the half through-hole 6.

Furthermore, the method as shown FIGS. 6 to 11 requires a plurality of drilling processes and plating processes and is troublesome, and thus the production term becomes longer. In addition, it is required to apply a copper plating onto the thin substrate 21, and in such a case failure easily takes place due to handling miss in the plating process. Thus, problems exist in that the payroll increases and also the production yield ends in an unsatisfactory result.

SUMMARY OF THE INVENTION

It is, therefore, an object of this invention to provide a method for producing a multilayer printed wiring board which can eliminate the foregoing problems associated with the conventional techniques, and which makes it possible to suppress occurrence of failure associated with boring of via holes for electrically connecting circuit patterns of first- and second-surface layers to inner circuit patterns, and also to shorten the production term and reduce the production cost.

The method for producing a multilayer printed wiring board according to this invention comprises the steps of:

forming a prescribed circuit pattern including a connecting pad on both faces of an inner wiring substrate;

disposing first and second copper foils for surface layer on both sides of the inner wiring substrate so that each of first and second prepreg sheets is sandwiched between each of the first and second copper foils for surface layer and each face of the inner wiring substrate, each of the first and second prepreg sheets being provided with a through-hole therethrough at desired position corresponding to a position where the connecting pad on each face of the substrate is formed;

bonding the resulting structure under heat and pressure;

selectively removing the copper foil for surface layer within an area which matches the connecting pad;

irradiating the area, from which the copper foil for surface layer is removed, with laser beams to form a via hole and allow the connecting pad to be exposed;

embedding a conductive paste in the via hole;

forming a through-hole running through one of the copper foils for surface layer to the other copper foil for surface layer; and patterning the copper foils for surface layer.

DETAILED DESCRIPTION OF THE PREFERRED EMBODIMENTS

According to this invention, first, each of first and second copper foils for surface layer is disposed on each side of an inner wiring substrate, whose upper and lower faces have connecting pads, through each of first and second prepreg sheets provided with through-holes therethrough at desired positions corresponding to the positions where the connecting pads are formed, and the resulting structure or assembly is processed by applying heat and pressure thereto using a pressure device. Thus, the first and second copper foils for surface layer are integrally bonded to the substrate so that each of the prepreg sheets is sandwiched between each of the copper foils and each face of the substrate. The through-hole of the prepreg sheet is filled with a resin molten out of the prepreg sheet during processing. Then, the copper foil present in an area which matches the connecting pad is removed and thereafter the area is irradiated with laser beams to remove the resin therefrom and form a via hole, resulting in that the connecting pad of the inner wiring substrate is exposed. Next, a conductive paste is embedded in the via hole. Thus, the connecting pad of the inner wiring substrate is electrically connected to the circuit pattern formed by patterning the copper foil for surface layer through the conductive paste embedded in the via hole.

According to this invention, as mentioned above, the resin filled in the through-hole of the prepreg sheet is removed by the irradiation of laser beams to form the via hole which reaches from the surface of the copper foil for the surface layer to top of the connecting pad of the inner wiring substrate. Thus a drilling speed is high and the drill hardly walks away from the required position of the via hole. Therefore, the method of this invention can shorten the production term and also reduce the production cost as compared with the conventional method.

Next, an embodiment of this invention will be described with reference to accompanying drawings, in which FIGS. 12 to 20 are partially and schematically cross-sectional diagrams for explaining steps of the method for producing the multilayer printed wiring board according to this invention.

Figure 1:
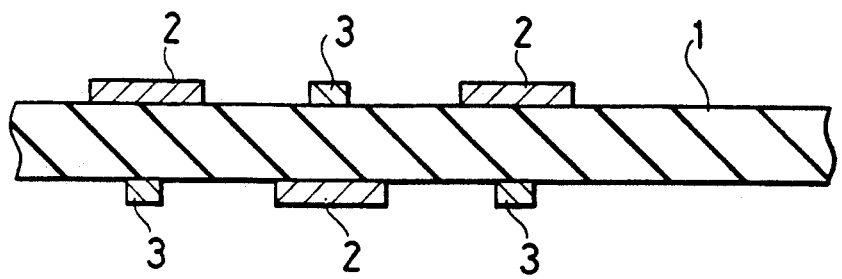
FIG. 1 is a partially and schematically cross-sectional diagram for explaining a step of a conventional method for producing a multilayer printed wiring board provided with via T/H's.
Figure 2:
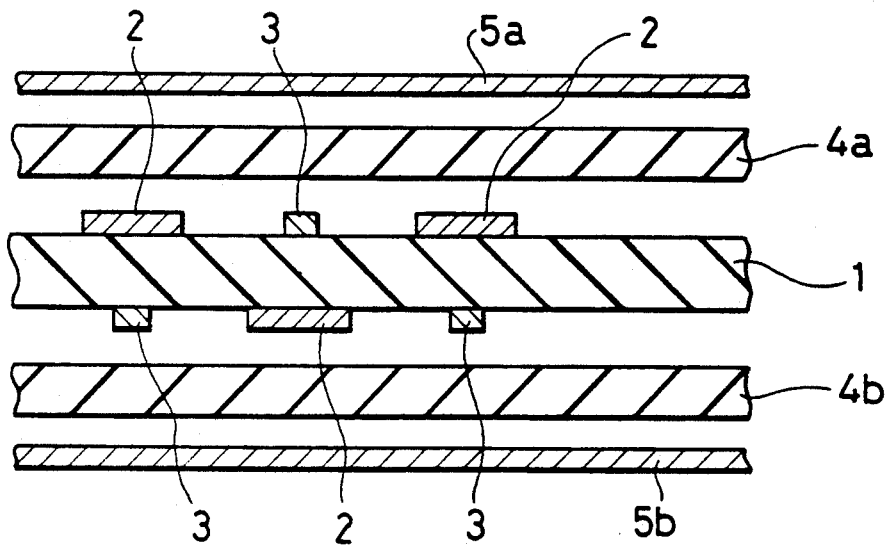
FIG. 2 is a partially and schematically cross-sectional diagram for explaining a step, performed subsequent to the step shown in FIG. 1, of the conventional method.
Figure 3:
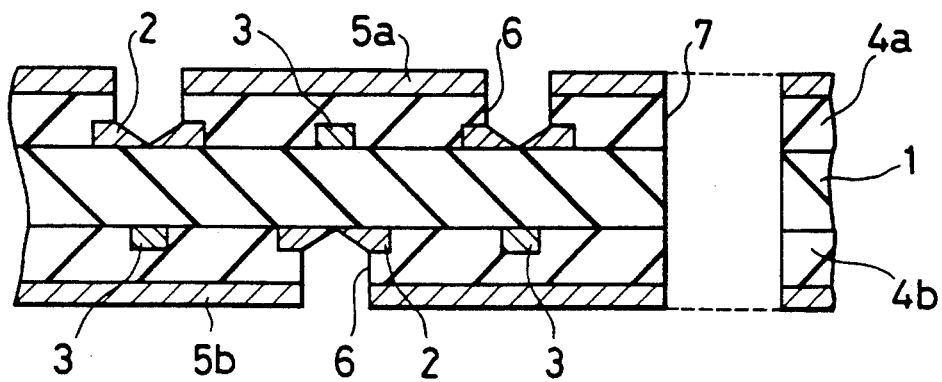
FIG. 3 is a partially and schematically cross-sectional diagram for explaining a step, performed subsequent to the step shown in FIG. 2, of the conventional method.
Figure 4:
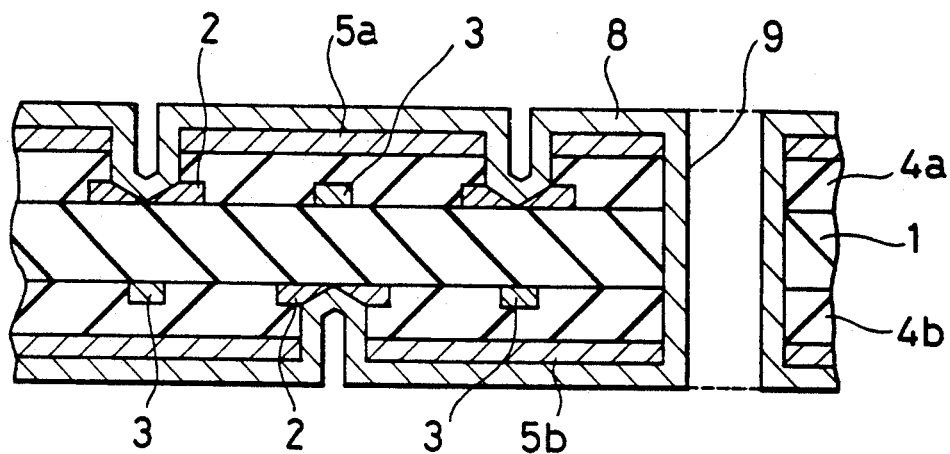
FIG. 4 is a partially and schematically cross-sectional diagram for explaining a step, performed subsequent to the step shown in FIG. 3, of the conventional method.
Figure 5:
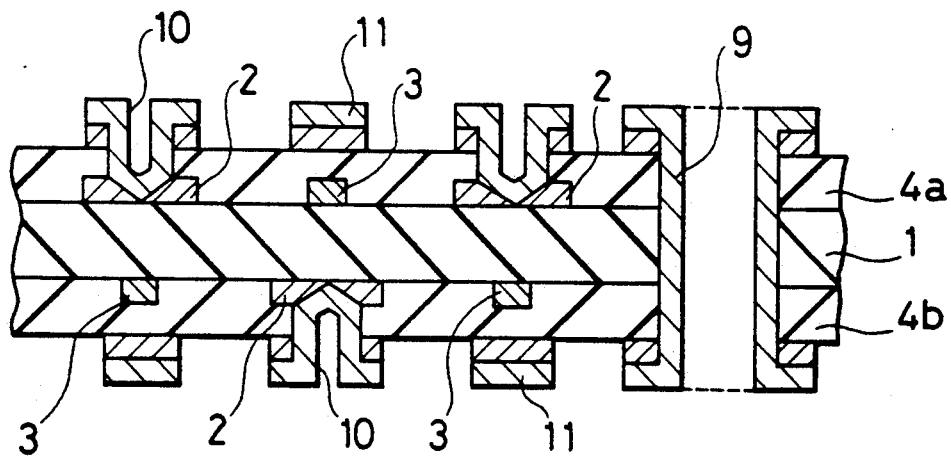
FIG. 5 is a partially and schematically cross-sectional diagram for explaining a step, performed subsequent to the step shown in FIG. 4, of the conventional method.
Figure 6:
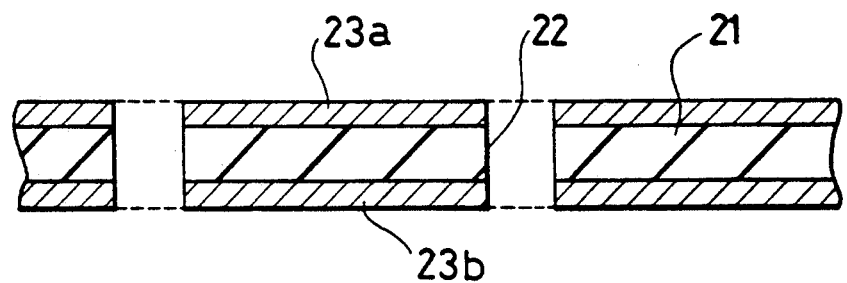
FIG. 6 is a partially and schematically cross-sectional diagram for explaining a step of another conventional method for producing a multilayer printed wiring board provided with via T/H's.
Figure 7:
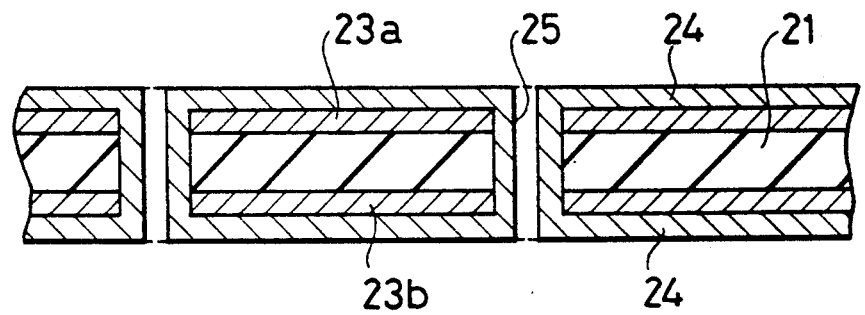
FIG. 7 is a partially and schematically cross-sectional diagram for explaining a step, performed subsequent to the step shown in FIG. 6, of the conventional method.
Figure 8:
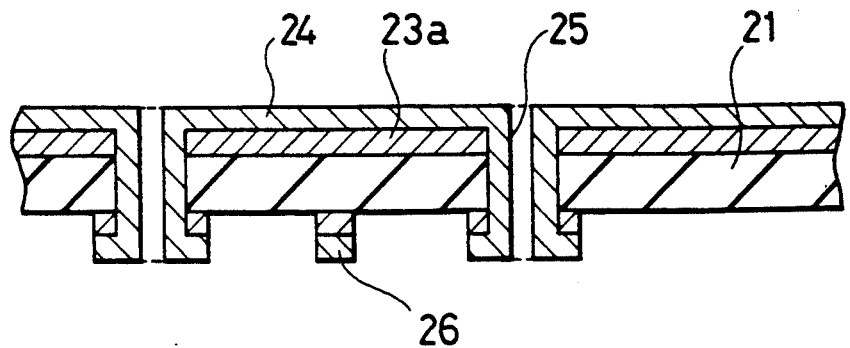
FIG. 8 is a partially and schematically cross-sectional diagram for explaining a step, performed subsequent to the step shown in FIG. 7, of the conventional method.
Figure 9:
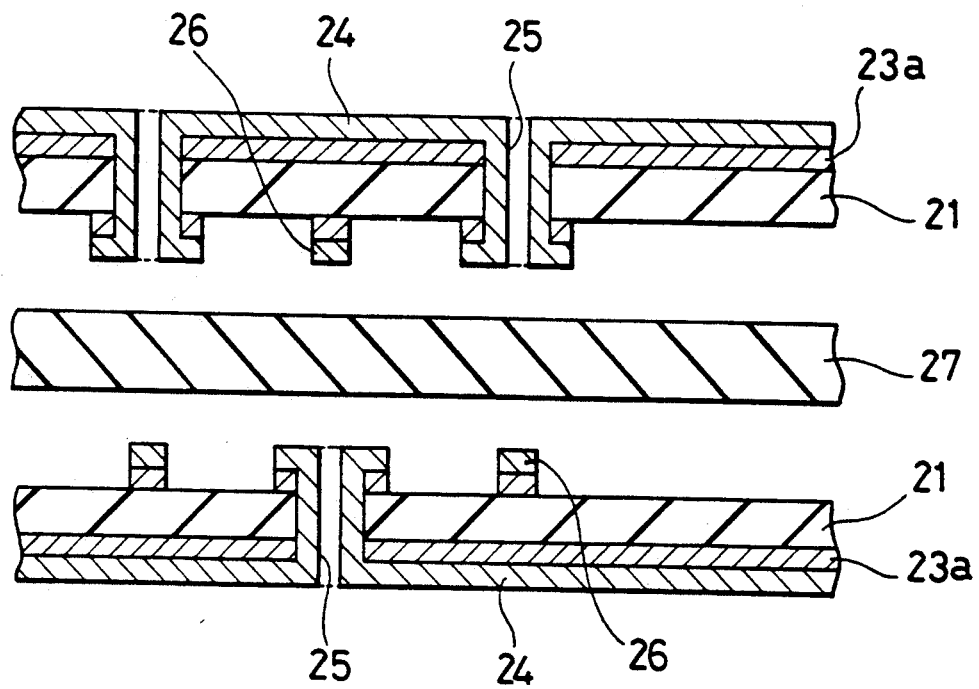
FIG. 9 is a partially and schematically cross-sectional diagram for explaining a step, performed subsequent to the step shown in FIG. 8, of the conventional method.
Figure 10:
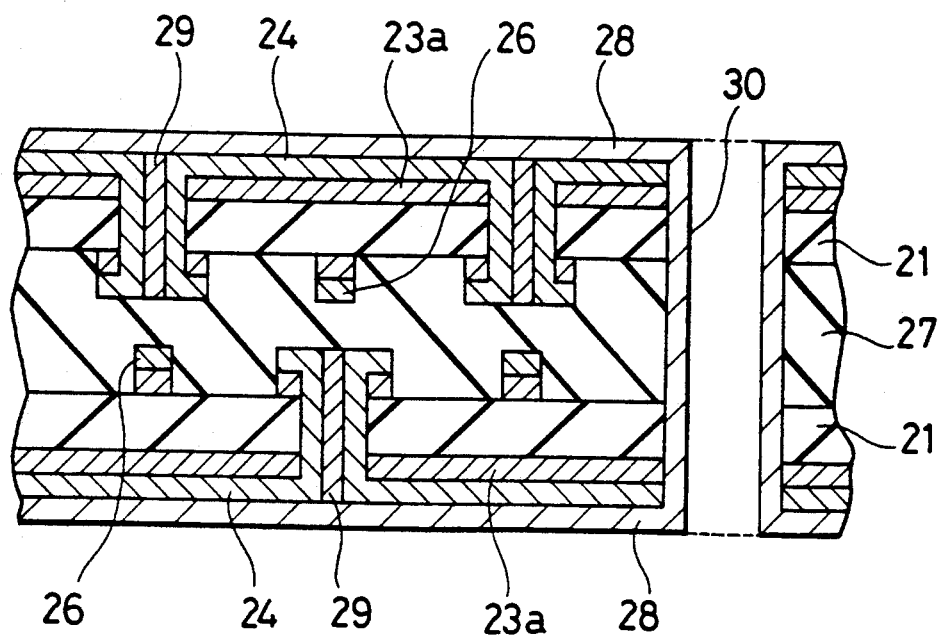
FIG. 10 a partially and schematically cross-sectional diagram for explaining a step, performed subsequent to the step shown in FIG. 9, of the conventional method.
Figure 11:
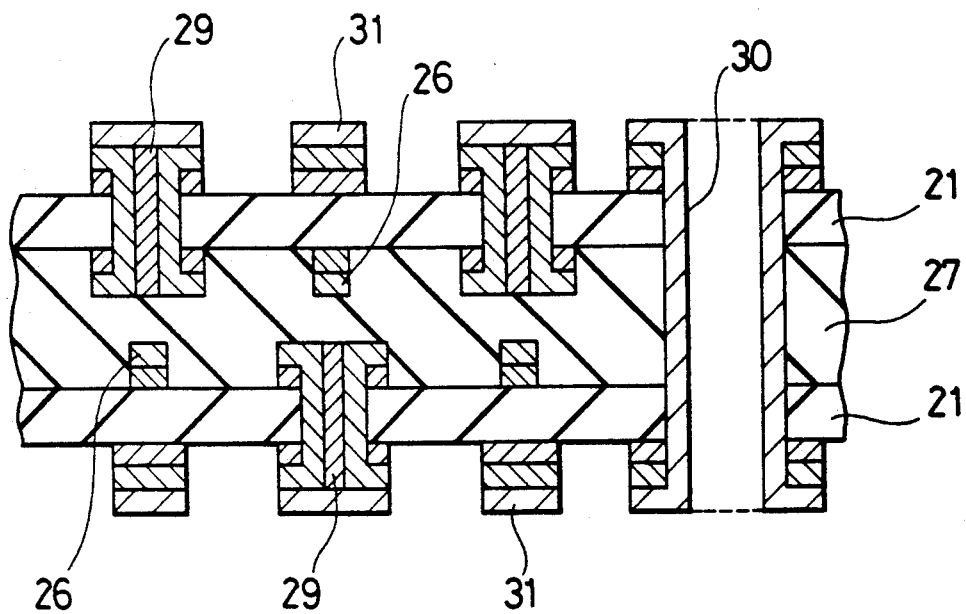
FIG. 11 is a partially and schematically cross-sectional diagram for explaining a step, performed subsequent to the step shown in FIG. 10, of the conventional method.
Figure 12:
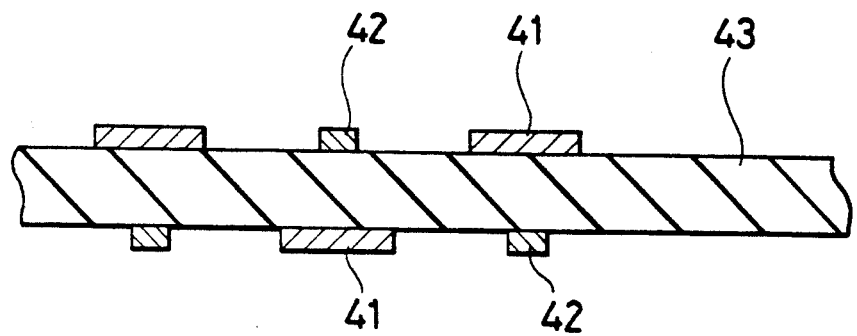
FIG. 12 is a partially and schematically cross-sectional diagram for explaining a step of an embodiment of a method for producing a multilayer printed wiring board according to this invention.

Referring now to FIG. 12, first, connecting pads 41 and inner circuit patterns 42 are formed by patterning copper foils of upper and lower faces of a copper-clad insulating substrate (an inner wiring substrate) 43 according to the publicly known circuit forming process. For the insulating substrate 43, there is used, for instance, a copper-clad substrate which is obtained by bonding a copper foil to the both faces of a glass cloth impregnated with a resin such as an epoxy, polyimide, phenol or fluorocarbon (e.g. Teflon (trade mark; Du Pont Co. Ltd.)) resin or the like. For Teflon, there can be used, for instance, polytetrafluoroethylene, fluorinated ethylene propylene or the like.

Figure 13:
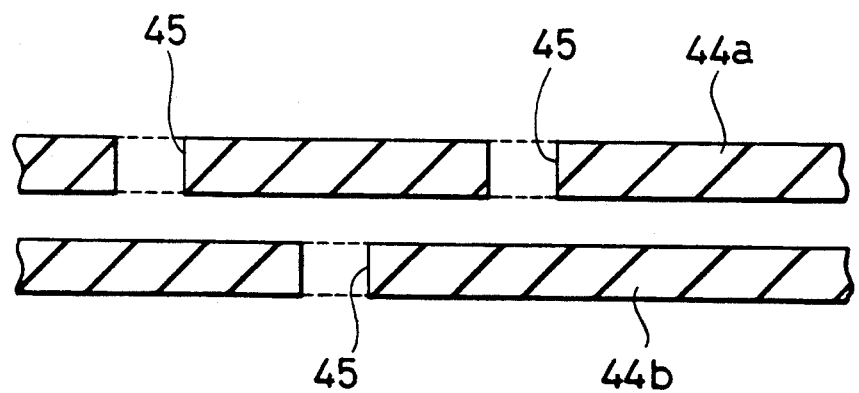
FIG. 13 is a partially and schematically cross-sectional diagram for explaining a step, performed subsequent to the step shown in FIG. 12, of the method according to this invention.

Now, as shown in FIG. 13, two prepreg sheets 44a and 44b having a thickness of about 0.03 to about 0.2 mm are prepared, and prepreg through-holes 45 having a diameter of about 0.05 to about 0.25 mm are bored in the prescribed positions of each of the prepreg sheets 44a and 44b (positions corresponding to the positions where the connecting pads 41 of each face of the substrate 43 are formed). If the connecting pads 41 of the upper and/or lower faces of the substrate 43 stand close together in a pitch of about 0.5 mm or less, the prepreg through-holes 45 may be bored in such a way that some of the through-holes running through the prepreg sheet 44a and some of those running through the prepreg sheet 44b overlap each other.

Figure 14:
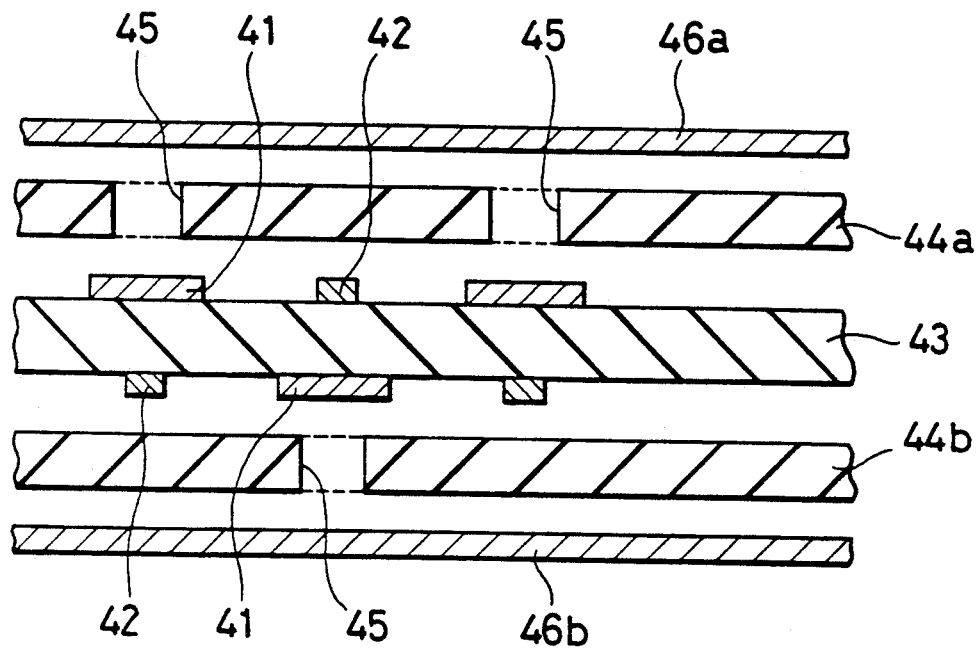
FIG. 14 is a partially and schematically cross-sectional diagram for explaining a step, performed subsequent to the step shown in FIG. 13, of the method according to this invention.

Then, as shown in FIG. 14, copper foils 46a and 46b for surface layer having a thickness of about 9 to about 70 μm are disposed on the both sides of the substrate 43, respectively, so that each of the prepreg sheets 44a and 44b is sandwiched between each of the copper foils 46a and 46b and each face of the substrate 43. And the substrate 43, prepreg sheets 44a and 44b and copper foils 46a and 46b are integrally bonded by heating the resulting structure at a temperature of about 150° to about 250° C. when the resin such as epoxy, polyimide, phenol or the like is used for the substrate 43 or at a temperature of about 400° C. when Teflon is used for the substrate 43, while pressurizing the structure to a pressure of about 5 to about 40 kg/cm$^2$, using a heat-pressure device. For the heat-pressure device, there can be used, for instance, a hydraulic pressing machine, a hydraulic vacuum pressing machine or autoclave or the like.

Figure 15:
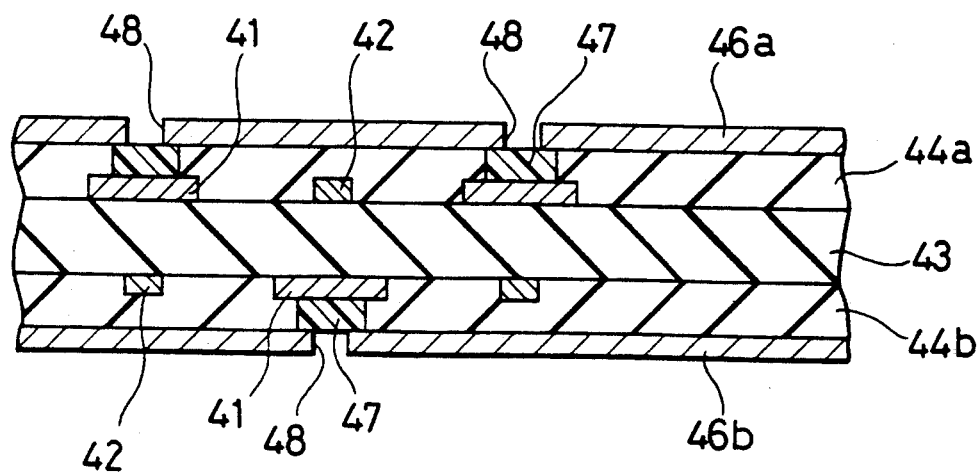
FIG. 15 is a partially and schematically cross-sectional diagram for explaining a step, performed subsequent to the step shown in FIG. 14, of the method according to this invention.

Referring now to FIG. 15, the copper foils 46a and 46b for surface layer within an area which matches the connecting pad 41 are selectively removed to form openings 48 having a diameter of about 0.01 to about 0.4 mm in the copper foils 46a and 46b. For a process for removing the copper foil, it is preferred to use an etching process or spot facing. Incidentally, during the above-mentioned heat-pressure processing step, the prepreg through-holes 45 are filled with a resin 47 molten or fused out of the prepreg sheets 44a and 44b, and thus the resin 47 is exposed at the openings 48.

Figure 16:
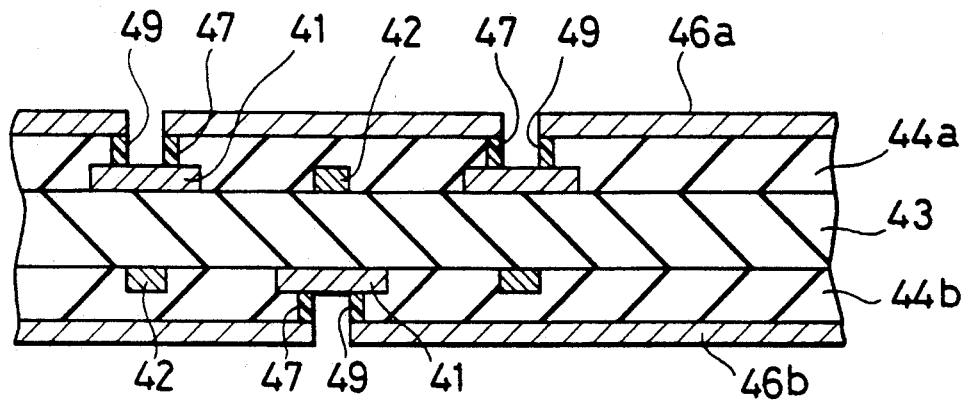
FIG. 16 is a partially and schematically cross-sectional diagram for explaining a step, performed subsequent to the step shown in FIG. 15, of the method according to this invention.

Then, as shown in FIG. 16, the exposed resin 47 at the openings 48 is removed by the irradiation of laser beams to thereby form openings (i.e. via holes) 49 for a conductive layer and expose the connecting pads 41.

Figure 17:
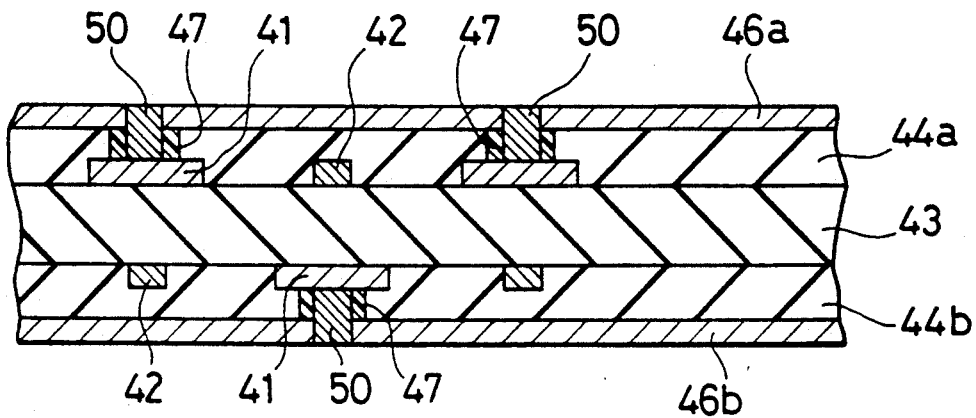
FIG. 17 is a partially and schematically cross-sectional diagram for explaining a step, performed subsequent to the step shown in FIG. 16, of the method according to this invention.

Thereafter, a conductive paste fused by the irradiation of laser beams is poured into the openings 49 and then is solidified to electrically connect the connecting pads 41 to the copper foils 46a and 46b for surface layer through thus obtained conductive paste 50 as shown in FIG. 17.

For a source for laser beams which is used in forming of the opening 49 and embedding of the conductive paste, it is preferred to use an excimer laser apparatus with an about 250 nm wavelength since a finished shape of the opening 49 is good. Of course, the laser apparatus which can be used in this invention is not limited to the excimer laser apparatus and the other laser apparatus can be used so far as an expected effect is attained.

Figure 18:
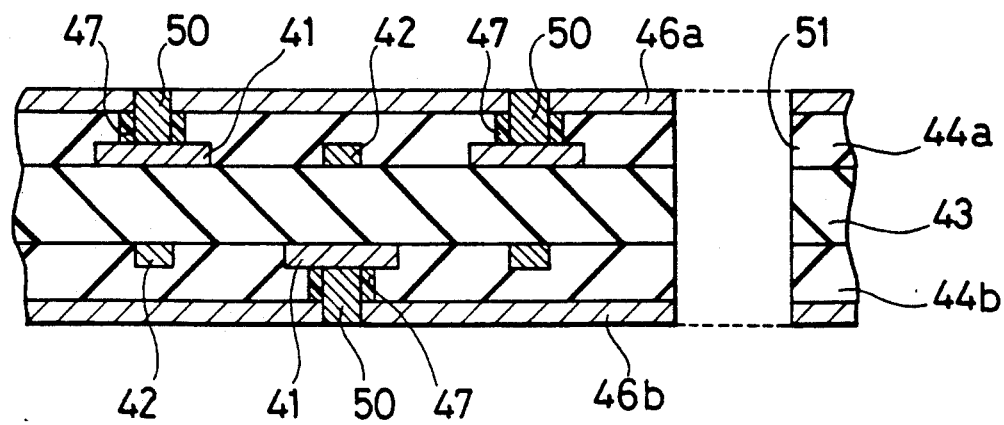
FIG. 18 is a partially and schematically cross-sectional diagram for explaining a step, performed subsequent to the step shown in FIG. 17, of the method according to this invention.

Referring now to FIG. 18, a through-hole 51 is selectively bored running through the resulting assembly, i.e. from the copper foil 46a to the copper foil 46b.

Figure 19:
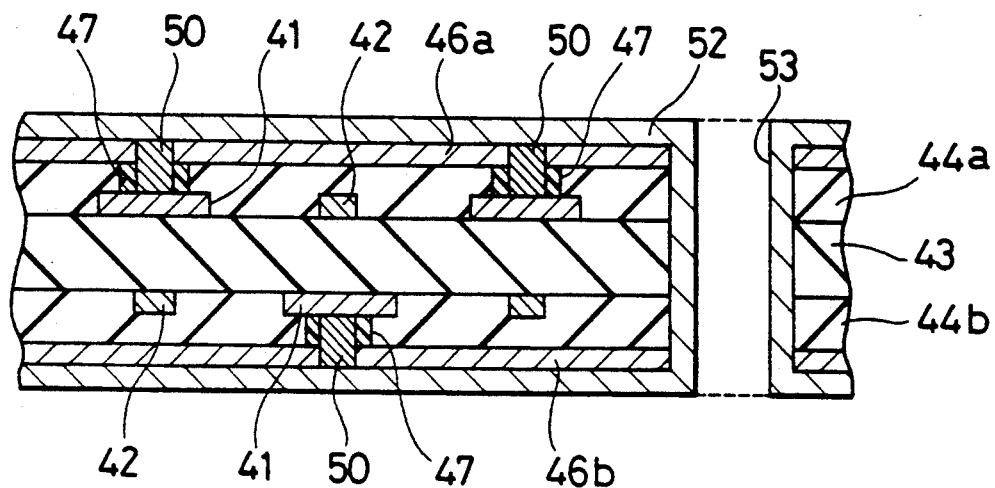
FIG. 19 is a partially and schematically cross-sectional diagram for explaining a step, performed subsequent to the step shown in FIG. 18, of the method according to this and invention.

Then, as shown in FIG. 19, copper plating is applied to the whole surface of the assembly including top of the embedded conductive paste 50 and an inner wall of the through-hole 51 to form a copper plating layer 52. The copper plating layer 52 is formed on the inner wall of the through-hole 51 to thus give a copper plated-through hole 53.

Figure 20:
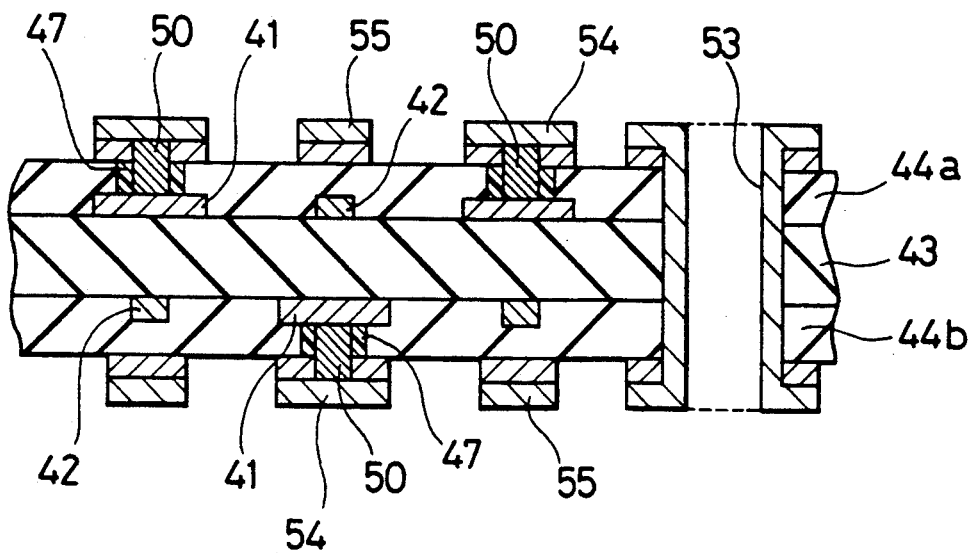
FIG. 20 is a partially and schematically cross-sectional diagram for explaining a step, performed subsequent to the step shown in FIG. 19, of the method according to this invention.

Thereafter, the copper plating layer 52 and the copper foils 46a and 46b are patterned to thereby give a completed multilayer printed wiring board provided with via T/H's 54, the running copper plated-through hole 53 and wiring circuit patterns 55 as shown in FIG. 20.

In the present embodiment, the resin 47 filled in the through-holes 45 of the prepreg sheets 44a and 44b is removed by using the laser apparatus to form the openings (i.e. via holes) 49 and then the conductive paste 50 is embedded in the openings 49 to electrically connect the copper foils 46a and 46b for surface layer to the connecting pads 41 of the inner wiring substrate. Therefore, it is possible to shorten the production term as compared with the conventional production term since the via T/H's are rapidly formed. In addition, since it is possible to precisely control the position where the via T/H's are positioned, the defective rate can be reduced and the production yield can be improved. Moreover, since it is not necessary to apply a plating to the thin inner wiring substrate, it is possible to free from failure due to handling miss and also it is possible to reduce the payroll. Therefore, according to this invention, the production cost of the multilayer printed wiring board can be reduced.

Now, in the above-mentioned embodiment, the excimer laser apparatus is used in both of the step of forming the openings 49 as shown in FIG. 16 and the step of embedding the conductive paste 50 as shown in FIG. 17. However, in place of the excimer laser apparatus, a carbon dioxide laser apparatus or a YAG (yttrium aluminum garnet) laser apparatus may be used. If the carbon dioxide laser apparatus or the YAG laser apparatus is used, a finished shape of the openings 49 is inferior to that obtained by using the excimer laser apparatus, but, it is possible to shorten the time required to form the openings 49. Also, the laser apparatus to be used may be different according to each step, for instance, the excimer laser apparatus may be used in the step of forming the openings 49 and the carbon dioxide laser apparatus or YAG laser apparatus may be used in the step of embedding the conductive paste 50.

As discussed above, according to this invention, the copper foil for surface layer within the area which matches the position of the connecting pad of the inner wiring substrate is selectively removed, the via hole is formed by irradiating the area, from which the copper foil is removed, with the laser beams, and the conductive paste is embedded in the via hole to electrically connect the copper foil for surface layer to the connecting pad. Therefore, it is possible to shorten the production term and also to reduce the defective rate of the product, and thus to reduce the production cost of the multilayer printed wiring board.

While this invention has been particularly described with reference to the preferred embodiment thereof, it will be understood by those skilled in the art that the foregoing and other changes may be made in the above-mentioned method without departing from the spirit and scope of the invention.

What is claimed is:

1. A method for producing a multilayer printed wiring board comprising the steps of:
   forming a prescribed circuit pattern including a connecting pad on both faces of an inner wiring substrate;
   disposing first and second copper foils for surface layer on both sides of said inner wiring substrate so that each of first and second prepreg sheets is sandwiched between each of said first and second copper foils for surface layer and each face of said inner wiring substrate, each of said first and second prepreg sheets being provided with a through-hole therethrough at desired position corresponding to a position where said connecting pad on each face of said inner wiring substrate is formed;
   bonding the resulting structure under heat and pressure;
   selectively removing said copper foil for surface layer within an area which matches said connecting pad;
   irradiating said area, from which said copper foil for surface layer is removed, with laser beams to form a via hole and allow said connecting pad to be exposed;
   embedding a conductive paste in said via hole;
   forming a through-hole running through one of said copper foils for surface layer to the other copper foil for surface layer; and
   patterning said copper foils for surface layer.

2. The method for producing a multilayer printed wiring board as defined in claim 1 in which said inner wiring substrate is a copper-clad insulating substrate comprising a glass cloth impregnated with a resin selected from epoxy, polyimide, phenol and fluorocarbon resins, and copper foils clad on upper and lower faces of said glass cloth.

3. The method for producing a multilayer printed wiring board as defined in claim 1 in which each of said first and second prepreg sheets is about 0.03 to about 0.2 mm thick and said through-hole running through each of said first and second prepreg sheets has a diameter of about 0.05 to about 0.25 mm.

4. The method for producing a multilayer printed wiring board as defined in claim 1 in which each of said copper foils for surface layer is about 9 to about 70 $\mu$m thick.

5. The method for producing a multilayer printed wiring board as defined in claim 1 in which each of said first and second copper foils for surface layer is integrally bonded to each face of said inner wiring substrate through each of said first and second prepreg sheets at a temperature of about 150° to about 250 ° C., provided that said inner wiring substrate is a copper-clad insulating substrate comprising a glass cloth impregnated with a resin selected from epoxy, polyimide and phenol resins and copper foils clad on upper and lower faces of said glass cloth, and under a pressure of about 5 to about 40 kg/cm$^2$.

6. The method for producing a multilayer printed wiring board as defined in claim 1 in which each of said first and second copper foils for surface layer is integrally bonded to each face of said inner wiring substrate through each of said first and second prepreg sheets at a temperature of about 400° C., provided that said inner wiring substrate is a copper-clad insulating substrate comprising a glass cloth impregnated with a fluorocarbon resin and copper foils clad on upper and lower faces of said glass cloth, and under a pressure of about 5 to about 40 kg/cm$^2$.

7. The method for producing a multilayer printed wiring board as defined in claim 1 in which said area of the copper foil for surface layer to be selectively removed comprises an opening having a diameter of about 0.01 to about 0.4 mm.

8. The method for producing a multilayer printed wiring board as defined in claim 1 in which said step of selectively removing said copper foil for surface layer is performed by an etching process or spot facing.

9. The method for producing a multilayer printed wiring board as defined in claim 1 in which, after forming said through-hole running through one of said copper foils for surface layer to the other copper foil for surface layer, copper plating is applied to the whole surface of said first and second copper foils for surface layer including top of said embedded conductive paste and inner wall of said through-hole running through one of said copper foils for surface layer to the other copper foil for surface layer.

10. The method for producing a multilayer printed wiring board as defined in claim 1 in which a source of said laser beams comprises an excimer laser apparatus with an about 250 nm wavelength.

11. The method for producing a multilayer printed wiring board as defined in claim 1 in which a source of said laser beams comprises a carbon dioxide laser apparatus or YAG laser apparatus.

12. The method for producing a multilayer printed wiring board as defined in claim 1 in which said via hole is formed by using an excimer laser apparatus and said embedding step of the conductive paste is performed by using a carbon dioxide laser apparatus or YAG laser apparatus.

13. A method for producing a multilayer printed wiring board comprising the steps of:
- forming a prescribed inner circuit pattern including a connecting pad on both faces of an inner copper-clad insulating substrate by patterning copper foils of upper and lower faces of said substrate;
- disposing first and second copper foils for surface layer on both sides of said substrate so that each of first and second prepreg sheets is sandwiched between each of said first and second copper foils for surface layer and each face of said substrate, each of said first and second prepreg sheets being provided with a through-hole therethrough at a desired position corresponding to a position where said connecting pad on each face of said substrate is formed and being about 0.03 to about 0.2 mm thick, said through-hole having a diameter of about 0.05 to about 0.25 mm and each of said copper foils for surface layer being about 9 to about 70 $\mu$m thick;
- integrally bonding the resulting structure under heat and pressure;
- selectively removing said copper foil for surface layer within an area which matches said connecting pad according to an etching process or spot facing, said area comprising an opening having a diameter of about 0.01 to about 0.4 mm;
- irradiating said area, from which said copper foil for surface layer is removed, with laser beams using an excimer laser apparatus with an about 250 nm wavelength, carbon dioxide laser apparatus or YAG laser apparatus to form a via hole and allow said connecting pad to be exposed;
- embedding a conductive paste in said via hole;
- forming a through-hole running through one of said copper foils for surface layer to the other copper foil for surface layer;
- applying copper plating to the whole surface of said first and second copper foils for surface layer including top of said embedded conductive paste and inner wall of said through-hole running through one of said copper foils for surface layer to the other copper foil for surface layer, to form copper plating layer; and
- patterning said copper plating layer and said copper foils for surface layer.

14. The method for producing a multilayer printed wiring board as defined in claim 13 in which said inner copper-clad insulating substrate comprises a glass cloth impregnated with a resin selected from epoxy, polyimide and phenol resins and copper foils clad on upper and lower faces of said glass cloth, and said bonding step is performed by heating said structure at a temperature of about 150° to about 250° C. under a pressure of about 5 to about 40 kg/cm$^2$.

15. The method for producing a multilayer printed wiring board as defined in claim 13 in which said inner copper-clad insulating substrate comprises a glass cloth impregnated with a fluorocarbon resin and copper foils clad on upper and lower faces of said glass cloth, and said bonding step is performed by heating said structure at a temperature of about 400° C. under a pressure of about 5 to about 40 kg/cm$^2$.

* * * * *